(12) United States Patent
Cambou

(10) Patent No.: US 9,007,807 B2
(45) Date of Patent: *Apr. 14, 2015

(54) MAGNETIC RANDOM ACCESS MEMORY CELL WITH A DUAL JUNCTION FOR TERNARY CONTENT ADDRESSABLE MEMORY APPLICATIONS

(75) Inventor: Bertrand Cambou, Palo Alto, CA (US)

(73) Assignee: Crocus Technology SA, Grenoble (FR)

( * ) Notice: Subject to any disclaimer, the term of this patent is extended or adjusted under 35 U.S.C. 154(b) by 320 days.

This patent is subject to a terminal disclaimer.

(21) Appl. No.: 13/430,963

(22) Filed: Mar. 27, 2012

(65) Prior Publication Data

US 2012/0250391 A1  Oct. 4, 2012

(30) Foreign Application Priority Data

Mar. 28, 2011 (EP) .................................... 11290150

(51) Int. Cl.
*G11C 11/22* (2006.01)
*G11C 15/04* (2006.01)
*G11C 11/56* (2006.01)
*G11C 15/02* (2006.01)

(52) U.S. Cl.
CPC .......... *G11C 15/046* (2013.01); *G11C 11/5607* (2013.01); *G11C 15/02* (2013.01)

(58) Field of Classification Search
USPC .......... 365/49.13, 65, 117, 145, 46, 100, 148, 365/157, 158, 171, 173
See application file for complete search history.

(56) References Cited

U.S. PATENT DOCUMENTS

| | | | |
|---|---|---|---|
| 8,023,299 B1* | 9/2011 | Gharia | 365/49.1 |
| 8,630,112 B2* | 1/2014 | Cambou | 365/158 |
| 2007/0165449 A1* | 7/2007 | Zheng et al. | 365/158 |

* cited by examiner

*Primary Examiner* — Thao H Bui
(74) *Attorney, Agent, or Firm* — Pearne & Gordon LLP

(57) ABSTRACT

The present disclosure concerns a MRAM cell comprising a first tunnel barrier layer comprised between a soft ferromagnetic layer having a free magnetization and a first hard ferromagnetic layer having a first storage magnetization; a second tunnel barrier layer comprised between the soft ferromagnetic layer and a second hard ferromagnetic layer having a second storage magnetization; the first storage magnetization being freely orientable at a first high predetermined temperature threshold and the second storage magnetization being freely orientable at a second predetermined high temperature threshold; the first high predetermined temperature threshold being higher than the second predetermined high temperature threshold. The MRAM cell can be used as a ternary content addressable memory (TCAM) and store up to three distinct state levels. The MRAM cell has a reduced size and can be made at low cost.

10 Claims, 2 Drawing Sheets

MAGNETIC RANDOM ACCESS MEMORY CELL WITH A DUAL JUNCTION FOR TERNARY CONTENT ADDRESSABLE MEMORY APPLICATIONS

FIELD

The present invention concerns a magnetic random access memory (MRAM) cell with a dual magnetic tunnel junction to be used as a ternary content addressable memory.

BACKGROUND

TCAM (ternary content addressable memory) is an important class of memory device widely used for internet networks. These elements work on matching input data with stored address data. One feature of such elements is that they require storing 3 distinct states 1, 0 and "don't care". Normal implementations of such a device require a very large number of transistors to enable such functions and this leads to extremely large die sizes.

A typical implementation of a static random access memory (SRAM) TCAM cell consists of a ternary storage containing two SRAM cells which combines ten to twelve transistors. It also has comparison logic, which is basically a XNOR gate using four additional pass transistors. Hence very large cells size of fourteen to sixteen transistors, hence a costly device. Conventional TCAM cells are often provided as a two standard SRAM cells with four or more transistors designed to implement the exclusive-OR (EOR) function.

Unlike a RAM chip, which has simple storage cells, each individual memory bit in a fully parallel TCAM has its own associated comparison circuit to detect a match between the stored data bit and the input data bit. TCAM chips are thus considerably smaller in storage capacity than regular memory chips. Additionally, match outputs from each cell in the data word can be combined to yield a complete data word match signal. The associated additional circuitry further increases the physical size of the TCAM chip. Furthermore, CAM and TCAM as it is done today (using SRAM elements) is intrinsically volatile, meaning that the data are lost when the power is turned off. As a result, every comparison circuit needs being active on every clock cycle, resulting in large power dissipation. With a large price tag, high power and intrinsic volatility, TCAM is only used in specialized applications where searching speed cannot be accomplished using a less costly method.

Emerging memory technology and high-speed lookup-intensive applications are demanding ternary content addressable memories with large word sizes, which suffer from lower search speeds due to large cell capacitance.

SUMMARY

The present disclosure concerns a magnetic random access memory (MRAM) cell comprising a soft ferromagnetic layer having a magnetization that can be freely aligned; a first hard ferromagnetic layer having a first storage magnetization; a first tunnel barrier layer comprised between the soft ferromagnetic layer and the a first hard ferromagnetic layer; a second hard ferromagnetic layer having a second storage magnetization; and a second tunnel barrier layer comprised between the soft ferromagnetic layer and the second hard ferromagnetic layer; wherein the first storage magnetization can be freely oriented at a first high predetermined temperature threshold and the second storage magnetization can be freely oriented at a second predetermined high temperature threshold; the first high predetermined temperature threshold being higher than the second predetermined high temperature threshold.

In an embodiment, the magnetic element can further comprise a first antiferromagnetic layer pinning the first storage magnetization below the first high predetermined temperature threshold, and a second antiferromagnetic layer pinning the second storage magnetization below the second predetermined high temperature threshold.

In another embodiment, the first hard ferromagnetic layer can have a first junction resistance-area product and the second hard ferromagnetic layer can have a second junction resistance-area product that is substantially equal to the first junction resistance-area product.

The present disclosure also pertains to a method for writing to the MRAM cell comprising:

heating the magnetic element to a temperature above the first predetermined high temperature threshold;

applying a write magnetic field in a first direction such as to align the first storage magnetization and the second storage magnetization in accordance with the write magnetic field.

In an embodiment, said write magnetic field can be applied in a first direction for storing a first data or in a second direction for storing a second data.

In another embodiment, the method can further comprise cooling the magnetic element (2) below the second predetermined high temperature threshold.

In yet another embodiment, the method can further comprise:

cooling the magnetic element to an intermediate temperature comprised below the first predetermined high temperature threshold and above the second predetermined high temperature threshold;

applying the write magnetic field in a second direction opposed to the first direction, such as to align the second storage magnetization in the second direction in accordance with the write magnetic field for storing a third data; and cooling the magnetic element below the second predetermined high temperature threshold.

Also disclosed is a method for reading the MRAM cell, comprising:

measuring an initial resistance value of the magnetic element with the stored data;

providing a first search data to the sense layer and determining the matching between the first search data and the stored data; and providing a second search data to the sense layer and determining the matching between the second search data and the stored data.

The MRAM cell disclosed herein can be used as a ternary content addressable memory. The MRAM cell can store three distinct state levels "1", "0" and "X" (don't care) and be used as a matching device thus allowing an implementation as a TCAM cell with a drastically reduced cell size and cost.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
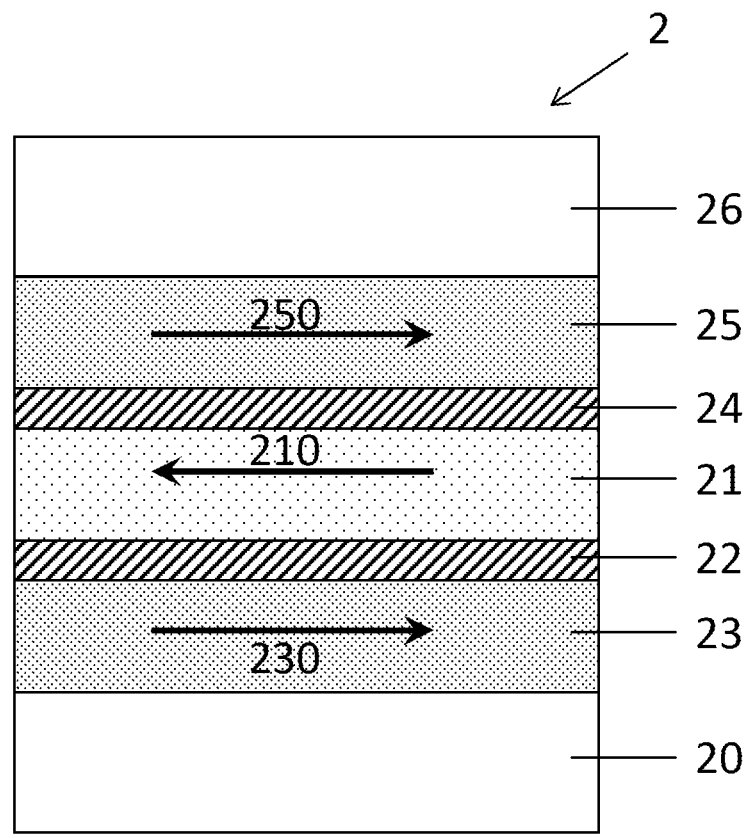
FIG. 1 shows a view of a magnetic random access memory (MRAM) cell comprising a first storage layer, a second storage layer and a sense layer according to an embodiment.

In an embodiment illustrated in FIG. 1, a magnetic random access memory (MRAM) cell 1 comprises a magnetic element 2 that is formed from a dual magnetic tunnel junction comprising a first tunnel barrier layer 22 having a first junction resistance-area product $RA_1$ and a first hard ferromagnetic layer, or first storage layer 23, having a first storage magnetization 230. The magnetic element 2 further comprises a second tunnel barrier layer 24 having a second junction resistance-area product $RA_2$ and a second hard ferromagnetic layer, or second storage layer 25 having a second storage magnetization 250. A soft ferromagnetic layer, or sense layer 21, having a sense magnetization 210 that can be freely aligned is comprised between the first and second tunnel barrier layer 22, 24.

In the example of FIG. 1, the magnetic element 2 further comprises a first antiferromagnetic layer 20 and a second antiferromagnetic layer 26. The first antiferromagnetic layer 20 is adapted to exchange couple the first storage layer 23 such that the first storage magnetization 230 can be freely oriented at a first high temperature threshold Tw1, and pinned below this temperature. The second antiferromagnetic layer 26 is adapted to exchange couple the second storage layer 25 such that the second storage magnetization 250 can be freely oriented at a second high temperature threshold Tw2, and pinned below this temperature. In an embodiment, the first predetermined high temperature threshold Tw1 is greater than the second predetermined high temperature threshold Tw2.

In an illustrative example, the first storage layer 23 can be made from a NiFe/CoFeB-based alloy and the first antiferromagnetic layer 20 can be made from an IrMn-based alloy. The second storage layer 25 can be made from a CoFeB/NiFe-based alloy and the second antiferromagnetic layer 26 can be made from a FeMn-based alloy. The sense layer 21 is preferably made from a CoFeB-based alloy.

In an embodiment, the first junction resistance-area product $RA_1$ is substantially equal to the second junction resistance-area product $RA_2$. A first tunnel magneto resistance $TMR_1$ of the first tunnel barrier layer 22, first storage layer 23 and the sense layer 21 will then be substantially the same as a second tunnel magneto resistance $TMR_2$ of the second tunnel barrier layer 24, second storage layer 25 and the sense layer 21. The first and second tunnel barrier layer 22, 24 are preferably made from MgO with where both the first and second junction resistance-area products $RA_1$, $RA_2$ are substantially equal to 20 ohm $\mu m^2$.

The MRAM cell 1 can further comprises a current line (not represented) in electrical communication with one end of the magnetic element 2 and a selection transistor (also not represented) in electrical communication with the other end of the magnetic element 2.

In an embodiment, the MRAM cell 1 is written using a thermally assisted write operation. More particularly, providing a first write data to the MRAM cell 1 comprises the steps of:

heating the magnetic element 2 to/at a temperature above the first predetermined high temperature threshold Tw1, such as to free the first and second storage magnetizations 230, 250;

applying a write magnetic field in a first direction such as to align both the first storage magnetization 230 and the second storage magnetization 250 in that first direction in accordance with the write magnetic field; and cooling the magnetic element 2 to a temperature that is below the second predetermined high temperature threshold Tw2 such that the first and second storage magnetization 230, 250 are pinned in the written state by the first and second antiferromagnetic layer 20, 26, respectively.

Figure 2:
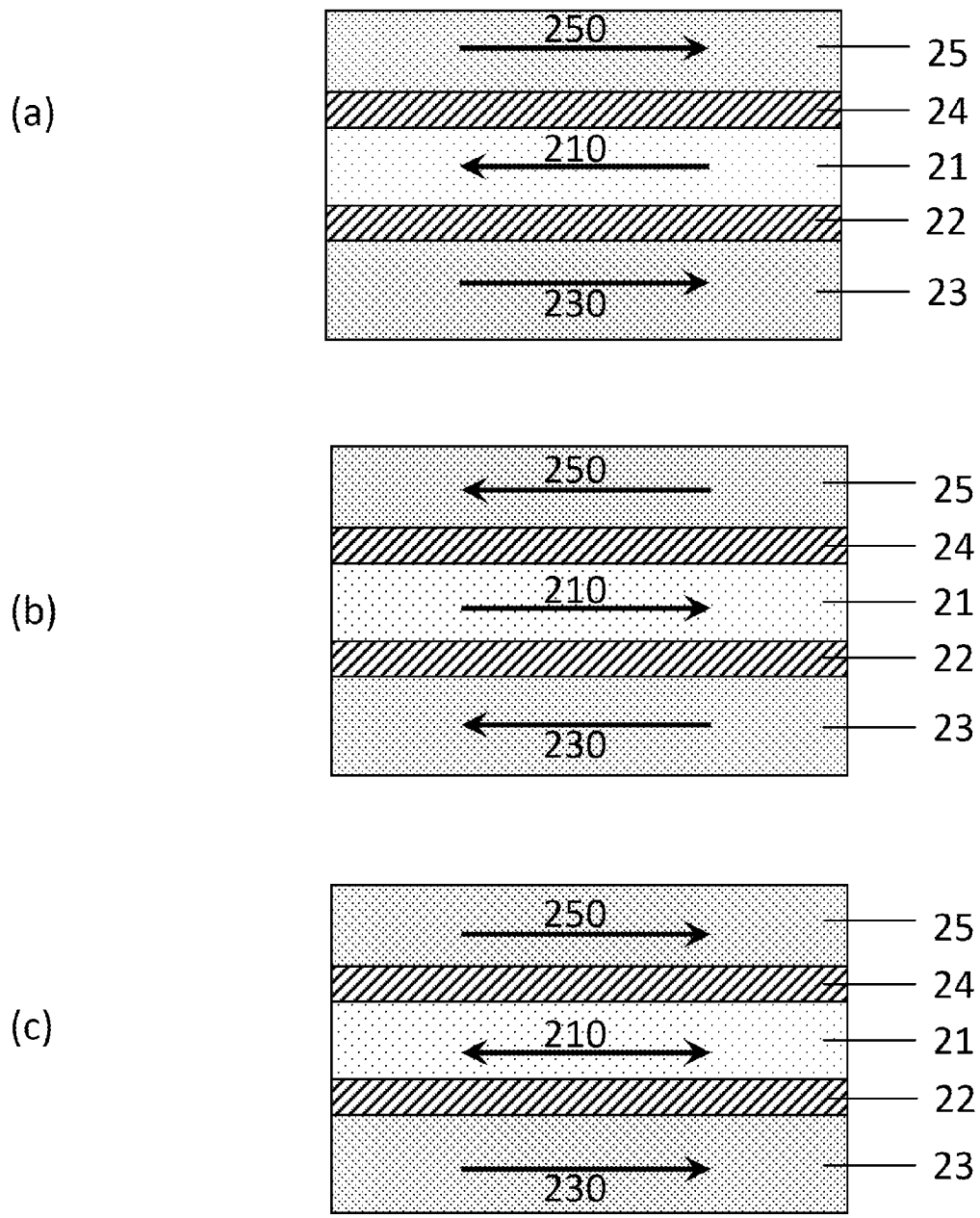
FIGS. 2a to c illustrate the orientation of the magnetization of the first and second storage layer, and of the sense layer.

After cooling and in the absence of the write magnetic field, the sense layer 21 is in the equilibrium state and its sense magnetization 210 is oriented antiparallel to the first and second storage magnetization 230, 250. A first stored data "0" thus corresponds to the magnetic element 2 having a first state level. The orientation of the first storage magnetization 230, the second storage magnetization 250 and of the sense magnetization 210 are illustrated in FIGS. 2a to c. In FIGS. 2a to c the first and second antiferromagnetic layers 20, 26 are not represented. More particularly, FIG. 2a represents the orientation of storage magnetizations 230, 250 and of the sense magnetization 210 for the first stored data "0".

In another embodiment, a second write data can be provided to the magnetic element 1 by performing the heating step described above. The write magnetic field is then applied a second direction that is opposed to the first direction, such as to align both the first storage magnetization 230 and the second storage magnetization 250 in the second direction. After cooling to a temperature below the second predetermined high temperature threshold Tw2, and in the absence of the write magnetic field (equilibrium), the sense magnetization 210 is oriented antiparallel to the first and second storage magnetization 230, 250. The second stored data "1" thus corresponds to the magnetic element 2 having a second state level (see FIG. 2b).

In another embodiment, providing a third write data is performed by:

heating the magnetic element 2 to/at a temperature above the first predetermined high temperature threshold Tw1, such as to free the first and second storage magnetizations 230, 250;

applying the write magnetic field in the first direction such as to align both the first storage magnetization 230 and the second storage magnetization 250 in the first direction in accordance with the write magnetic field;

cooling the magnetic element 2 to/at an intermediate temperature that is comprised below the first predetermined high temperature threshold Tw1 and above the second predetermined high temperature threshold Tw2 such as to pin the first storage magnetization 230 by the first antiferromagnetic layer 20 such that the second storage magnetization 250 can be freely oriented;

applying the write magnetic field in the second direction such as to align the second storage magnetization 250 in the second direction in accordance with the write magnetic field; and cooling the magnetic element 2 to a temperature below the second predetermined high temperature threshold Tw2 such that the first and second storage magnetization 230, 250 are pinned in the written state by the first and second antiferromagnetic layer 20, 26, respectively.

In this latter configuration, the sense magnetization 210 can be oriented either in the first or second direction, i.e., parallel or antiparallel to the first and second storage magnetization 230, 250. The third stored data "X" thus corresponds to the magnetic element 2 having a third intermediate state level (see FIG. 2c).

Heating the magnetic element 2 can be performed by passing a heating current (not shown) in the magnetic element 2, via the current line. Cooling the magnetic element 2 to the intermediate temperature threshold can thus be performed by reducing the heating current intensity, and cooling the magnetic element 2 to the low temperature threshold can be achieved by blocking the heating current. Applying the write magnetic field can be performed by passing a field current (not shown) in the current line.

According to an embodiment, a read operation of the written MRAM cell 1 comprises:

measuring an initial resistance value $R_o$ of the magnetic element 2 with the stored data;

providing a first search data "0" to the sense layer 21 and determining the matching between the first search data and the stored data; and providing a second search data "1" to the sense layer 21 and determining the matching between the second search data and the stored data.

Measuring the initial resistance $R_o$ is performed by passing a read current in the magnetic element 2 in the absence of external magnetic field (zero field). Providing the first and second search data "0", "1" comprises applying the read magnetic field in a first and second direction, respectively, such as to orient the sense magnetization 210 in accordance with the read magnetic field direction. Determining the matching between the first and second search data and the stored data comprises measuring a first read resistance $R_1$ and a second read resistance $R_2$ by passing the read current in the magnetic element 2 when the magnetic field is applied in the first and second direction, respectively.

The read operation disclosed herein is a self-referenced based read operation in the sense that the resistance of the magnetic element 2 is measured for the first and second search data "0", "1" (first and second read resistance) and the use of the reference cell is not required. Such self-referenced based read operation has also been disclosed in European patent application EP2276034 by the present applicant. Moreover, the read operation disclosed herein comprises determining the matching between the first and second search data and the stored data, instead of simply reading a stored value "0" or "1" as in a conventional read operation.

In the case of the first stored data "0" the initial resistance $R_o$ has a high value ($R_{max1}+R_{max2}$) that is determined by a first high resistance ($R_{max1}$) due to the antiparallel orientation of the sense magnetization 210 with the first storage magnetization 230 and a second high resistance ($R_{max2}$) due to the antiparallel orientation of the sense magnetization 210 with the second storage magnetization 250 (see Table I). Providing the first search data "0" orients the sense magnetization 210 antiparallel to the first and second storage magnetization 230, 250, and the measured value of the first read resistance $R_1$ is high ($R_{max1}+R_{max2}$). Providing the second search data "1" orients the sense magnetization 210 parallel to the first and second storage magnetization 230, 250, and the measured value of the second read resistance $R_2$ is low ($R_{min1}+R_{min2}$), where $R_{min1}$ is a first low resistance due to the parallel orientation of the sense magnetization 210 with the first storage magnetization 230, and $R_{min2}$ is a second low resistance due to the parallel orientation of the sense magnetization 210 with the second storage magnetization 230. Here, the difference between $R_2$ and $R_1$ corresponds to $\Delta R=(R_{max1}+R_{max2})-(R_{min1}+R_{min2})$.

In the case of the second stored data "1" the initial resistance $R_o$ has a high value ($R_{max1}+R_{max2}$). Providing the first search data "0" orients the sense magnetization 210 parallel to the first and second storage magnetization 230, 250 and the measured value of the first read resistance $R_1$ is low ($R_{min1}+R_{min2}$). Providing the second search data "1" orients the sense magnetization 210 antiparallel to the first and second storage magnetization 230, 250 and the measured value of the second read resistance $R_2$ is high ($R_{max1}+R_{max2}$).

In the case of the third stored data "X" the initial resistance $R_o$ has an intermediate value ($R_{min1}+R_{max2}$). Providing the first search data "0" orients the sense magnetization 210 parallel to the first storage magnetization 230 and antiparallel to the and second storage magnetization 250. Providing the second search data "1" orients the sense magnetization 210 antiparallel to the first storage magnetization 230 and parallel to the second storage magnetization 250. The measured value for both the first and second read resistance $R_1$, $R_2$ corresponds to an intermediate value ($R_{min1}+R_{max2}$). The same value of the first and second read resistance $R_1$, $R_2$ for the two search data "0" and "1" corresponds to a "don't care" state level of the MRAM cell 1, since the output (read resistance) is insensitive to the input state (search data). Table 1 reports the different resistance values measured for the initial resistance $R_o$ and first and second read resistance $R_1$, $R_2$.

TABLE 1

|  | stored data | stored data | stored data |
| --- | --- | --- | --- |
| Ro (zero field) | $R_{max1}+R_{max2}$ | $R_{max1}+R_{max2}$ | $R_{min1}+R_{max2}$ |
| $R_1$ (search data | $R_{max1}+R_{max2}$ | $R_{min1}+R_{min2}$ | $R_{min1}+R_{max2}$ |
| $R_2$ (search data | $R_{min1}+R_{min2}$ | $R_{max1}+R_{max2}$ | $R_{min1}+R_{max2}$ |

The MRAM cell 1 disclosed herein can thus be used as a ternary content addressable memory. The MRAM cell 1 can store three distinct state levels "1", "0" and "X" (don't care) and be used as a matching device thus allowing an implementation as a TCAM cell with a drastically reduced cell size and cost. Table 2 reports the matching between the first and second search data and the stored data. More particularly, determining the matching further comprises comparing the measured first and second read resistance ($R_1$, $R_2$) to the initial resistance value ($R_o$). A match corresponds to no change between the initial resistance value $R_o$ and the value of the first and second read resistance $R_1$, $R_2$.

TABLE 2

|  | stored data | stored data | stored data |
| --- | --- | --- | --- |
| search data "X" (zero | No change (match) | No change (match) | No change (match) |
| search data | No change | $R_2$ decreases by | No change |
| search data | $R_2$ decreases by | No change | No change |

An additional advantage of the MRAM cell 1 is that, during the write operation, both the first and second tunnel barrier layer 22, 24 contribute in heating the magnetic element 2 at the first and second predetermined high temperature threshold Tw1, Tw2. Consequently, the power required when passing the heating current for heating the magnetic element 2 can be reduced by a factor of about $\sqrt{2}$ as compared to the power required in a conventional magnetic tunnel junction comprising a single tunnel barrier layer. This results in an enhanced endurance of the MRAM cell 1 to voltage cycling during the write operation.

In addition, the MRAM cell 1 disclosed herein allows for comparing a "don't-care" search data. This can be handled by a second read at zero field. Clearly this leads to no resistance change and thus results in a match irrespective or the written state (search data "X").

REFERENCE NUMBERS AND SYMBOLS

1 MRAM cell
2 magnetic element
20 first antiferromagnetic layer
21 sense layer 22 first tunnel barrier layer
23 first storage layer
24 second tunnel barrier
25 second storage layer
26 second antiferromagnetic layer
210 sense magnetization
230 first storage magnetization
250 second storage magnetization
ΔR difference between $R_1$ and $R_2$
$RA_1$ first junction resistance-area product
$RA_2$ second junction resistance-area product
$R_{max1}$ first high resistance value
$R_{max2}$ second high resistance value
$R_{min1}$ first low resistance value
$R_{min2}$ second low resistance value
$R_o$ initial resistance
$R_1$ first read resistance
$R_2$ second read resistance
$TMR_1$ first tunnel magneto resistance
$TMR_2$ second tunnel magneto resistance
Tw1 first predetermined high temperature threshold
Tw2 second predetermined high temperature threshold

The invention claimed is:

1. A magnetic random access memory (MRAM) cell to be used as a ternary content addressable memory comprising a magnetic element comprising a soft ferromagnetic layer having a magnetization that can be freely aligned; a first hard ferromagnetic layer having a first storage magnetization; a first tunnel barrier layer comprised between the soft ferromagnetic layer and the first hard ferromagnetic layer; a second hard ferromagnetic layer having a second storage magnetization; and a second tunnel barrier layer comprised between the soft ferromagnetic layer and the second hard ferromagnetic layer;

the first storage magnetization being be freely orientable at a first high predetermined temperature threshold and the second storage magnetization being freely orientable at a second predetermined high temperature threshold; the first high predetermined temperature threshold being higher than the second predetermined high temperature threshold.

2. MRAM cell according to claim 1, wherein the magnetic element further comprises a first antiferromagnetic layer pinning the first storage magnetization below the first high predetermined temperature threshold, and a second antiferromagnetic layer pinning the second storage magnetization below the second predetermined high temperature threshold.

3. MRAM cell according to claim 1, wherein the first hard ferromagnetic layer has a first junction resistance-area product and the second hard ferromagnetic layer has a second junction resistance-area product that is substantially equal to the first junction resistance-area product.

4. MRAM cell according to claim 1, wherein the first hard ferromagnetic layer comprises a NiFe/CoFeB-based alloy and the second hard ferromagnetic layer comprises a CoFeB/NiFe-based alloy.

5. MRAM cell according to claim 1, wherein the first antiferromagnetic layer comprises an IrMn-based alloy and the second antiferromagnetic layer comprises a FeMn-based alloy.

6. MRAM cell according to claim 1, wherein the soft ferromagnetic layer comprises a CoFeB-based alloy.

7. MRAM cell according to claim 1, wherein the magnetic element is at a temperature above the first predetermined high temperature threshold.

8. MRAM cell according to claim 1, wherein the first and second storage magnetizations are both aligned with a magnetic field applied in a first direction for storing a first data, or wherein the first and second storage magnetizations are both aligned with a magnetic field applied in a second direction for storing a second data.

9. MRAM cell according to claim 1, wherein the magnetic element is at a temperature below the first predetermined high temperature threshold and above the second predetermined high temperature threshold.

10. MRAM cell according to claim 1, wherein the first storage magnetization is aligned with a magnetic field applied in a first direction and the second storage magnetization is aligned with a magnetic field applied in a second direction, for storing a third data.

* * * * *